(12) United States Patent
Srivastava et al.

(10) Patent No.: US 12,100,614 B2
(45) Date of Patent: Sep. 24, 2024

(54) APPARATUS FOR CONTROLLING LIFT PIN MOVEMENT

(71) Applicant: Applied Materials, Inc., Santa Clara, CA (US)

(72) Inventors: Anubhav Srivastava, Bangalore (IN); Bhaskar Prasad, Jamshedpur (IN); Kirankumar Neelasandra Savandaiah, Bangalore (IN); Thomas Brezoczky, Los Gatos, CA (US); Nitin Bharadwaj Satyavolu, Kakinada (IN)

(73) Assignee: Applied Materials, Inc., Santa Clara, CA (US)

( * ) Notice: Subject to any disclaimer, the term of this patent is extended or adjusted under 35 U.S.C. 154(b) by 409 days.

(21) Appl. No.: 17/233,213

(22) Filed: Apr. 16, 2021

(65) Prior Publication Data
US 2022/0336258 A1    Oct. 20, 2022

(51) Int. Cl.
    *H01L 21/687*    (2006.01)
(52) U.S. Cl.
    CPC .............................. *H01L 21/68742* (2013.01)
(58) Field of Classification Search
    CPC ......... H01L 21/68742; H01L 21/68785; H01L 21/67103; H01L 21/67109; H01L 21/67259; H01L 21/6831; H01L 21/68735; H01L 21/68764; H01L 21/68792; H01J 37/32715
    See application file for complete search history.

(56) References Cited

U.S. PATENT DOCUMENTS

| | | | | |
|---|---|---|---|---|
| 10,892,180 | B2 * | 1/2021 | Chia | H01L 21/6831 |
| 2010/0110603 | A1 * | 5/2010 | LaFontaine | H01L 21/6831 |
| | | | | 361/234 |
| 2018/0130677 | A1 * | 5/2018 | Wakiyama | H01L 21/68785 |
| 2019/0033671 | A1 * | 1/2019 | Lee | H01L 27/1248 |
| 2019/0035671 | A1 * | 1/2019 | Ha | H01L 21/68757 |
| 2019/0111541 | A1 * | 4/2019 | Boyd, Jr. | H01L 21/68757 |
| 2021/0035844 | A1 * | 2/2021 | Cho | H01L 21/68735 |
| 2022/0270898 | A1 * | 8/2022 | Savandaiah | H01J 37/32715 |
| 2022/0293451 | A1 * | 9/2022 | Sulyman | H01L 21/68785 |
| 2023/0207378 | A1 * | 6/2023 | Kim | H01L 21/67109 |
| | | | | 156/345.24 |

(Continued)

FOREIGN PATENT DOCUMENTS

| | | | |
|---|---|---|---|
| JP | H10308348 A | * | 11/1998 |
| JP | 2020155458 | * | 9/2020 |

(Continued)

*Primary Examiner* — Mahdi H Nejad
(74) *Attorney, Agent, or Firm* — Patterson & Sheridan LLP

(57) ABSTRACT

Embodiments of the present disclosure generally relate to lift pins and to apparatus for controlling lift pin movement. In an embodiment, an apparatus for positioning a substrate in a chamber is provided. The apparatus includes a chamber component, a lift pin having a top surface for supporting the substrate and a lift pin shaft and a stopper. The apparatus further includes a compressible element positioned between the chamber component and the stopper, the compressible element further positioned around the lift pin shaft, the lift pin being moveable relative to a substrate transfer plane by movement of a substrate support in contact with the compressible element.

13 Claims, 7 Drawing Sheets

(56) References Cited

U.S. PATENT DOCUMENTS

2023/0215705 A1* 7/2023 Jeong ................ H01L 21/6831
156/345.54

FOREIGN PATENT DOCUMENTS

| JP | 2020155458 | A | * | 9/2020 |
| KR | 20110045327 | | * | 5/2011 |
| KR | 20230061959 | A | * | 5/2023 |

* cited by examiner

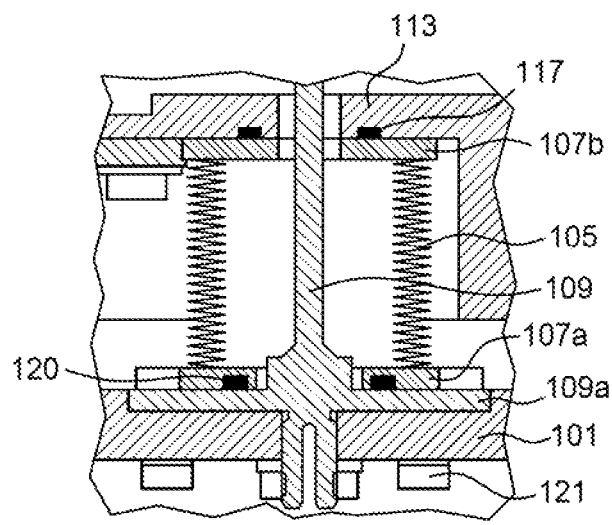
FIG. 1C
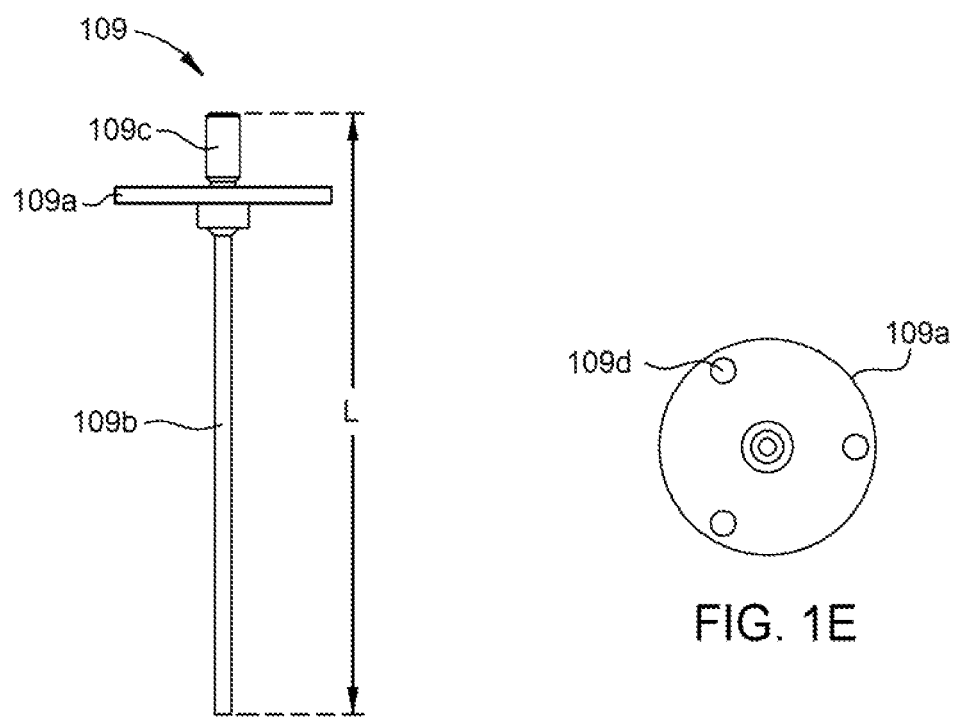
FIG. 1D
FIG. 1E

APPARATUS FOR CONTROLLING LIFT PIN MOVEMENT

BACKGROUND

Field

Embodiments of the present disclosure generally relate to lift pins and to apparatus for controlling lift pin movement.

Description of the Related Art

Conventional cluster tools include various chambers for performing a variety of processes during substrate processing. When multiple process stations are placed in a single chamber body, two or more different pressure conditions are utilized, requiring isolation of the process environment(s) from the remaining areas of the chamber body. Openings in the substrate support through which lift pins project are potential areas where leakage and cross-contamination can occur, causing, e.g., loss of vacuum and loss of product sterility. The leakage and cross-contamination affect the uniformity of substrates being processes.

In addition, substrate handling and substrate lifting are key parameters to achieve uniformity across the processed substrate. Conventional substrate lift pins have high positional shift from one lift pin to another, causing wear on processing equipment and particulate generation. Moreover, the planarity shift between two or more lift pins affects substrate shift. Existing methodologies to correct the planarity shift and positional shift of the lift pins, such as torque adjustment, are challenging because the substrate support, among other equipment, blocks access to the lift pins. Even if the lift pins can be accessed, adjustment of the lift pins can cause the lift pins to rub against the substrate support, leading to particulate generation.

Further, conventional designs for actuation of the lift pins utilize multiple components, such as motors, drivers, and linear motion rail assemblies. As the number of components increases, maintenance costs increase and the reliability of the system decreases. Moreover, each of these components uses separate software controls, increasing the complexity of the design.

There is a need for new and improved lift pins, apparatus comprising such lift pins, and lift pin actuators that overcome, e.g., one or more deficiencies in the art.

SUMMARY

Embodiments of the present disclosure generally relate to lift pins and to apparatus for controlling lift pin movement.

In an embodiment, an apparatus for positioning a substrate in a chamber is provided. The apparatus includes a chamber component, a lift pin having a top surface for supporting the substrate and a lift pin shaft, and a push rod coupled to the lift pin, the push rod having a main body and a collar, the collar having a larger diameter than a diameter of the main body. The apparatus further includes a spring positioned around an outside diameter of the push rod, the spring further positioned between the chamber component and the collar of the push rod, the lift pin being moveable relative to a top surface of a substrate support disposed in the chamber by movement of the substrate support when the collar of the push rod and the substrate support are not in contact and being moveable with the substrate support by movement of the substrate support when the collar of the push rod and the substrate support are in contact.

In another embodiment, an apparatus for positioning a substrate in a chamber is provided. The apparatus includes a chamber component, a lift pin having a top surface for supporting the substrate and a lift pin shaft and a stopper. The apparatus further includes a compressible element positioned between the chamber component and the stopper, the compressible element further positioned around the lift pin shaft, the lift pin being moveable relative to a substrate transfer plane by movement of a substrate support in contact with the compressible element.

In another embodiment, an apparatus for positioning a substrate in a chamber is provided. The apparatus includes a substrate support having a lift pin hole formed therein, a lift pin having a top surface for supporting the substrate and a shaft, and a bellows positioned below the substrate support, the bellows having an opening in which the lift pin is disposed, the bellows expandable and contractible by movement of the substrate support. The apparatus further includes a bellows flange coupled to a bottom surface of the bellows, and a lift pin actuator positioned below the bellows flange, the lift pin actuator comprising a push rod for contacting a bottom surface of the bellows flange, a push rod flange positioned around an outside diameter of the push rod, and a spring positioned around the outside diameter of the push rod, the spring further positioned between a chamber component and the push rod flange. The lift pin is moveable relative to a substrate transfer plane by movement of the substrate support when the bellows and the substrate support are in contact, by movement of the push rod when the bellows flange and the push rod are in contact, or both.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting the scope of the disclosure, as the disclosure may admit to other equally effective embodiments.

FIG. 1C is an enlarged view of a portion of the example lift pin assembly of FIG. 1A according to at least one embodiment of the present disclosure.

FIG. 1D is a front view of an example lift pin according to at least one embodiment of the present disclosure.

FIG. 1E is a top view of the example lift pin shown in FIG. 1D according to at least one embodiment of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to lift pins and to apparatus for controlling lift pin movement. Briefly, embodiments described herein enable precise movement of lift pins for substrate handling, substantially reduce component wear, and prevent cross-contamination and vacuum loss from processing environments.

As described above, conventional lift pins and assemblies display high positional shift from one lift pin to another. The shifting causes misalignment of the lift pins, leading to wear on chamber components and particulate generation. Moreover, existing methodologies to correct planarity shift (the shift between two or more lift pins) as well as positional shifting of the lift pins, such as torque adjustment, are challenging because the substrate support and associated equipment blocks access to the lift pins. In contrast, the lift pin actuators and lift pin assemblies described herein can move lift pins more precisely than state-of-art systems and enable improved positional repeatability (e.g., lower positional shift from pin-to-pin) over conventional designs. As such, embodiments provided herein substantially minimize lift pin misalignment and substantially reduce the incidence of wear and particulate generation as compared to conventional designs.

Further, existing cluster tools are challenged by running different processes at the same time due to, e.g., cross-contamination issues and vacuum loss. To overcome such issues, embodiments described herein utilize, e.g., positive sealing of lift pin holes in the substrate support for accommodating the lift pins. By eliminating cross-contamination and vacuum loss, embodiments described herein enable greater flexibility to run multiple processes simultaneously. Moreover, embodiments described herein show, e.g., improved reliability and ease of serviceability due to, e.g., less-complex designs than the state-of-the-art. For example, and in some embodiments, motion of the lift pin is enabled utilizing a compressible element (e.g., bellows or spring), push rod, and/or a substrate support. Such a system replaces complex systems for lift-pin actuation that include motors, drivers, and linear motion rail assemblies.

Example Lift Pin Assembly

Embodiments described herein provide a lift pin assembly 100 as shown in FIGS. 1A-1E. The embodiments can be used in, e.g., a chamber of a cluster tool, however other chambers and tools are contemplated. The lift pin assembly described herein reduces the pin-to-pin positional shift by about 60% or more, thereby, e.g., enhancing positional accuracy of the lift pins.

Figure 1A:
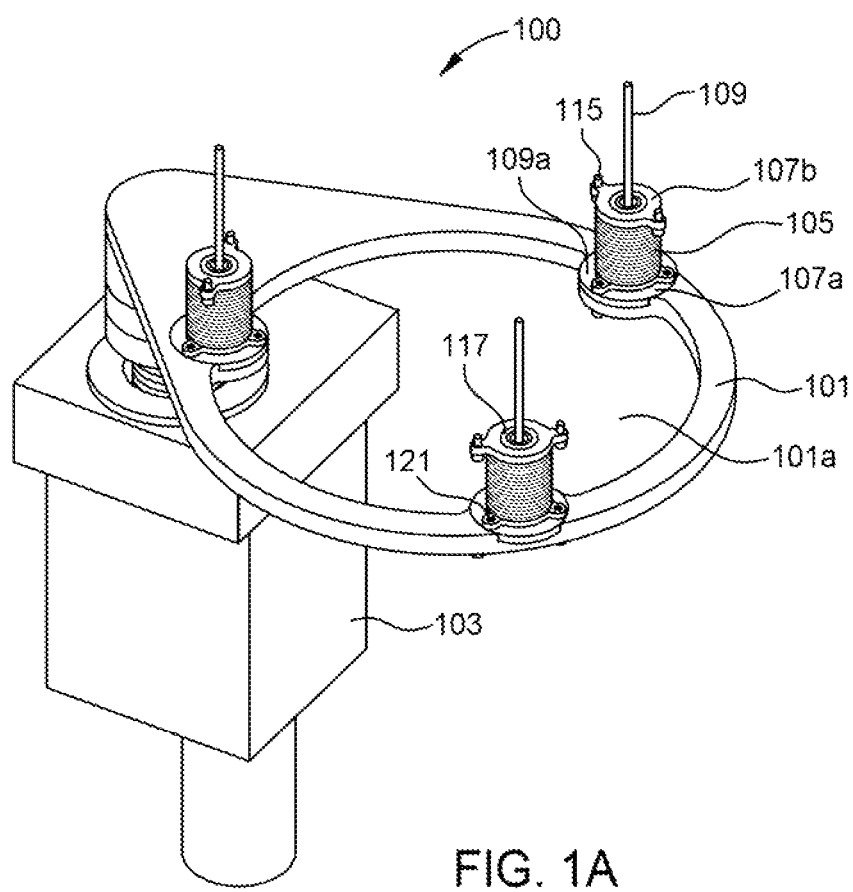
FIG. 1A is an isometric view of a portion of an example lift pin assembly according to at least one embodiment of the present disclosure.
Figure 1B:
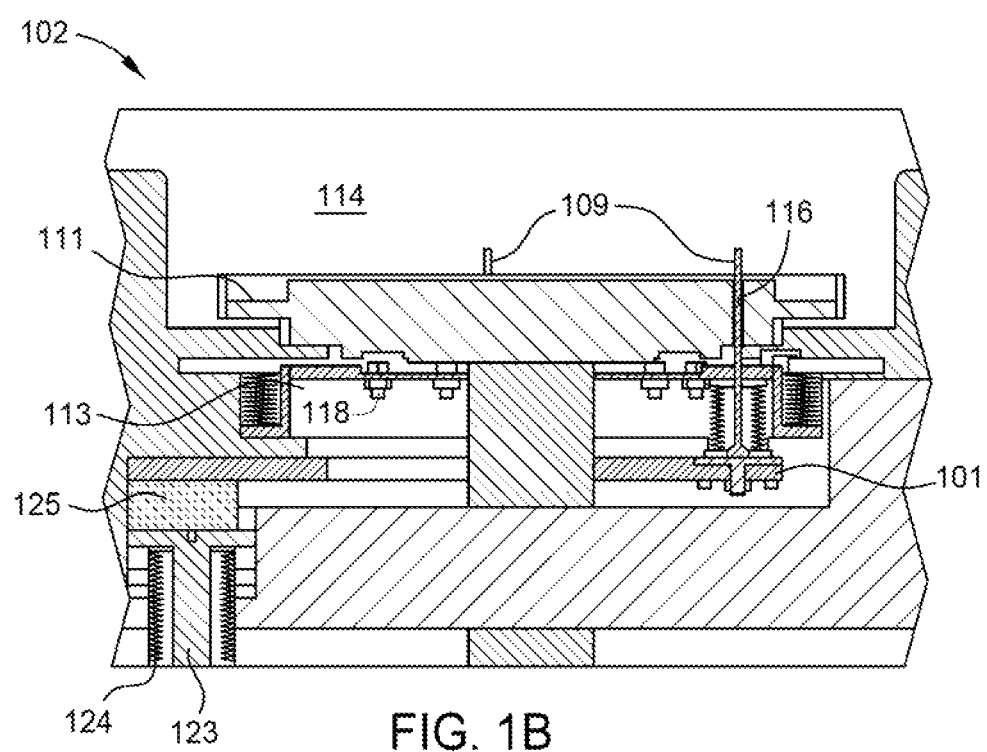
FIG. 1B is a schematic cross-sectional view of a processing chamber housing the example lift pin assembly of FIG. 1A, among other components according to at least one embodiment of the present disclosure.

Specifically, FIG. 1A is an isometric view of an example lift pin assembly 100 according to at least one embodiment of the present disclosure. FIG. 1B is a cross-section of a processing chamber housing the example lift pin assembly 100, among other components, and FIG. 1C is an enlarged view of a portion of the example lift pin assembly 100. FIGS. 1D and 1E show different views of an example lift pin.

Referring to FIG. 1A-1B, the lift pin assembly 100 includes a hoop ring 101 and a plurality of lift pins 109. The hoop ring 101 has an inner diameter 101a that can be used for, e.g., calibration. The hoop ring 101 is coupled to a motor and drive shaft assembly 103 for driving movement of the hoop ring 101. The hoop ring 101 is vertically positionable to enable transfer of substrates between a substrate support 111 and substrate transfer devices (e.g., robot end effectors) entering a process volume 114 of a chamber 102 in which the hoop ring 101 is installed. The hoop ring 101 can also be positionable to define a symmetrical confinement region around a substrate and a region immediately above the substrate support 111 during processing, providing a symmetrical processing environment. The hoop ring 101 may also be utilized for establishing a symmetrical confinement region within the processing volume 114 of the chamber 102.

As shown in FIGS. 1D and 1E, pin collar 109a of the lift pin 109 has a larger diameter than other portions of the lift pin 109, e.g., lift pin shaft 109b and external thread 109c. A diameter of the pin collar 109a can be from about 40 mm to about 60 mm, and a diameter of the lift pin shaft 109b can be from about 2 mm to about 6 mm. A length (L) of the lift pin 109 can be about 130 mm to about 150 mm, such as from about 135 mm to about 145 mm, such as about 140 to about 145 mm, such as about 142 mm. The pin collar 109a includes one or more through-holes 109d to couple the lift pins 109 to the hoop ring 101 by screws 121 (or bolts). Although three through-holes 109d are shown, more or less through-holes are contemplated.

Referring again to FIGS. 1A-1C, the lift pin assembly includes bellows 105 positioned around a portion of the lift pin 109 between and above the pin collar 109a. An opening through the bellows 105 is positioned around an outside diameter of the lift pin 109. A top bellows flange 107b and a bottom bellows flange 107a are positioned above and below the bellows 105, respectively, and around an outside diameter of the lift pin 109. The screws 121 further couple the hoop ring 101 and the pin collar 109a to the bottom bellows flange 107a. The top bellows flange 107b and bottom bellows flange 107a can be welded to bellows 105, and bolts/screws 115 can be utilized to seal top bellows flange 107b to flange 113. Tighter planarity and parallelism of the lift pins 109 is provided by, e.g., the lift pins 109 seated on the hoop ring 101. Planarity of the lift pins 109 is further assisted by mounting the bellows 105, bottom bellows flange 107a, and the lift pin 109 to the hoop ring 101 by the screws 121. An O-ring 117 (or seal) is positioned above the top surface of the top bellows flange 107b and around an outside diameter of the lift pin 109. Bellows 105 and O-ring 117 provide positive sealing and prevent (or at least mitigate) gas leakage between, e.g., two different pressure environments. This positive sealing enables, e.g., implementation of different processes at different stations simultaneously without cross-contamination and/or pressure loss.

FIGS. 1B and 1C show the lift pin assembly in the chamber 102 and an expanded view of the lift pin assembly in the chamber 102, respectively. The substrate support 111 is positioned above the bellows 105. The substrate support 111 has a plurality of lift pin holes 116 through which the plurality of lift pins 109 can move up and down for substrate movement/transfer. The O-ring 117 is positioned between an upper surface of each top bellows flange 107b and a surface of a flange 113. Top bellows flange 107b and O-ring 117 enable a positive seal with the flange 113. The flange 113 is coupled to the substrate support by bolts/screws 118. The planarity of the lift pins 109 is further assisted by the top bellows flange 107b being coupled to the substrate support 111 via the flange 113. An O-ring 120 is positioned between bottom bellows flange 107a and the pin collar 109a of the lift pin 109. The O-ring 120 further mitigates gas leakage and cross-contamination between, e.g., two different pressure environments.

The bellows 105 expands and contracts via movement of, e.g., the substrate support 111. Because the substrate support 111 moves up and down, the height of the lift pins 109 can be adjusted relative to an upper surface of the substrate support 111. The hoop ring 101 is coupled to the motor and drive shaft assembly 103 via a drive shaft 123. The drive shaft assembly 103 is operable to control a vertical elevation of the hoop ring within the chamber 102. In some embodiments, a drive shaft bellows 124 is utilized to prevent leakage between the drive shaft 123 and the chamber 102. A spacer 125 is coupled to the drive shaft assembly 103 and hoop ring 101 by, e.g., threaded screws, enabling contact between the drive shaft assembly 103 and the hoop ring 101.

Table 1 shows various parameters of positional shifts and planarity shifts between lift pins 109 of embodiments described herein (Example 1) and two comparative examples. The inner diameter 101a in the hoop ring is the starting point for calculating the positional shift of the lift pins.

TABLE 1

| | Parameter | Comparative Example 1 | Comparative Example 2 | Example 1 |
|---|---|---|---|---|
| 1 | Positional shift between lift pin and hole in hoop ring, inches | 0.0095 | 0.01125 | 0.01 |
| 2 | Positional shift between two lift pins due to tolerance stack-up, inches | 0.039 | 0.0425 | 0.04 |
| 3 | Planarity shift, inches | 0.0707 | 0.0355 | 0.005 |
| 4 | Total positional shift between two lift pins, inches | 0.1097 | 0.078 | 0.045 |
| 5 | RMS Value (77%), inches | 0.0845 | 0.0601 | 0.0346 |

The data shows that the example lift pin assembly is improved over the state-of-the-art. For example, the planarity shift of the example lift pin assembly is about 14× and about 7× lower than that of comparative example 1 and comparative example 2, respectively. In addition, the total positional shift between lift pins of the example lift pin assembly is about 2-3× lower than comparative example 1 and comparative example 2. Moreover, without affecting parameters 1 and 2, the planarity shift (parameter 3), total positional shift between two lift pins (parameter 4) and RMS value (parameter 5) are lowered significantly.

Example Lift Pin Actuators

Figure 2:
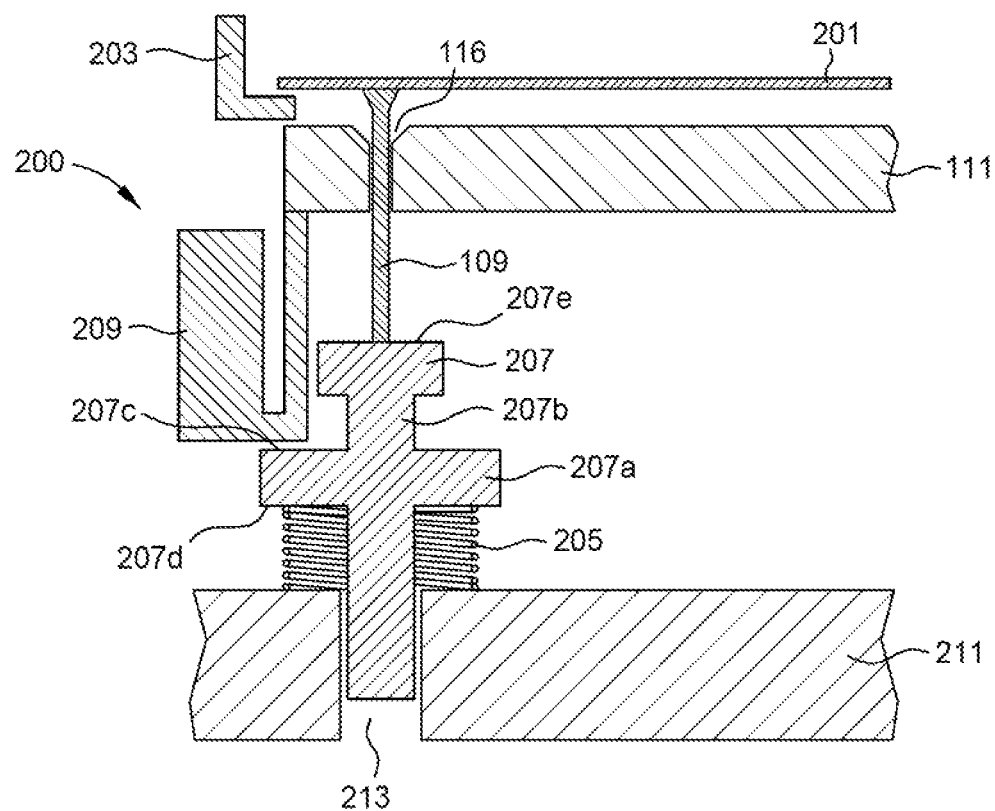
FIG. 2 is a schematic cross-sectional view of an example lift pin actuator according to at least one embodiment of the present disclosure.
Figure 3A:
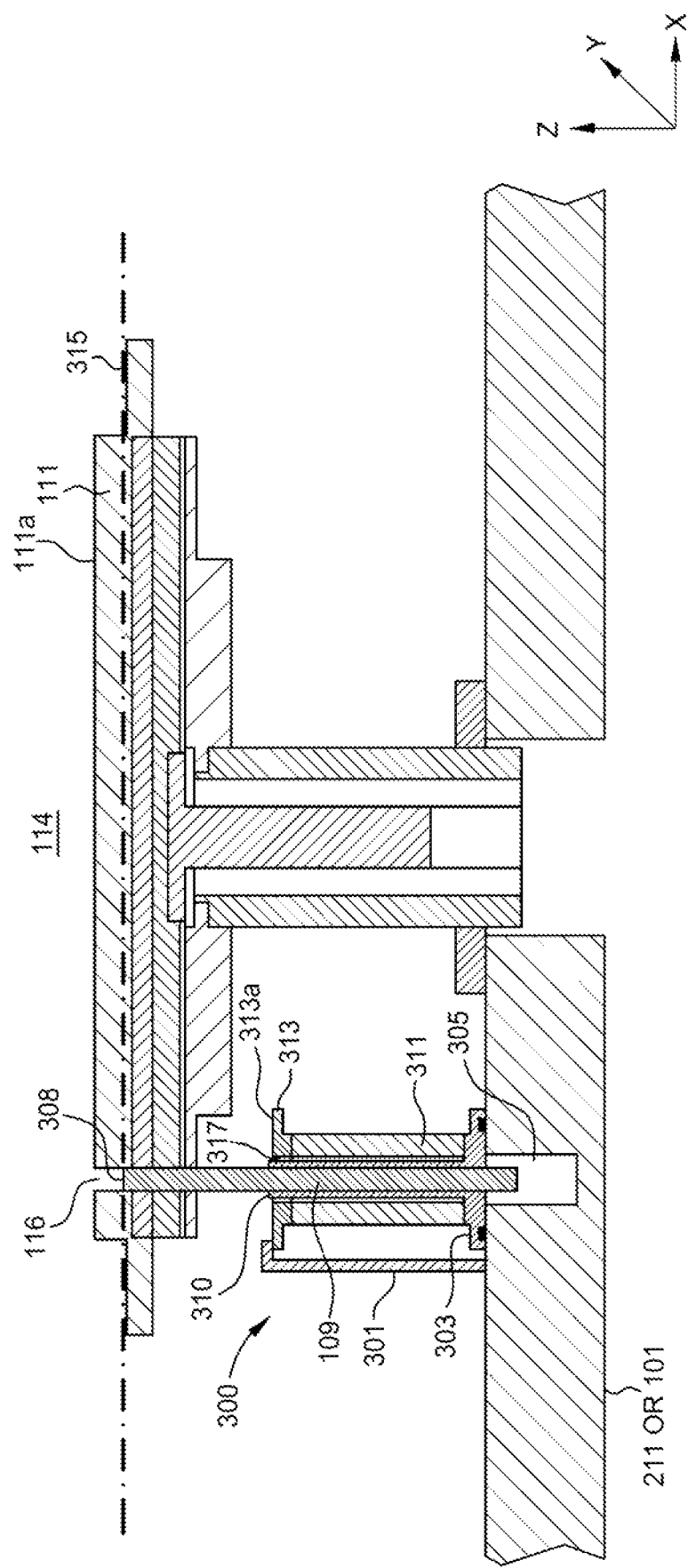
FIG. 3A is a schematic cross-sectional view of an example lift pin actuator according to at least one embodiment of the present disclosure.
Figure 3B:
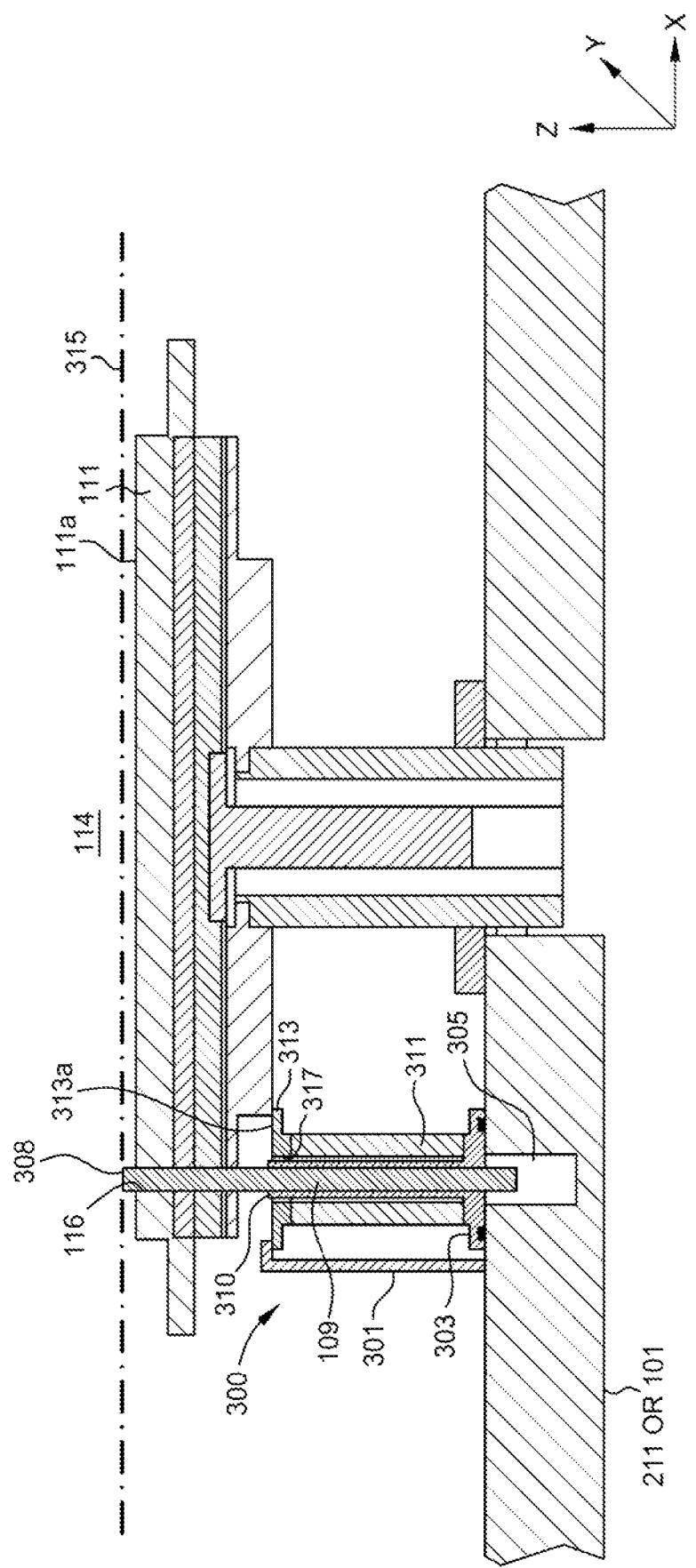
FIG. 3B illustrates movement of the lift pin actuator of FIG. 3A according to at least one embodiment of the present disclosure.
Figure 3C:
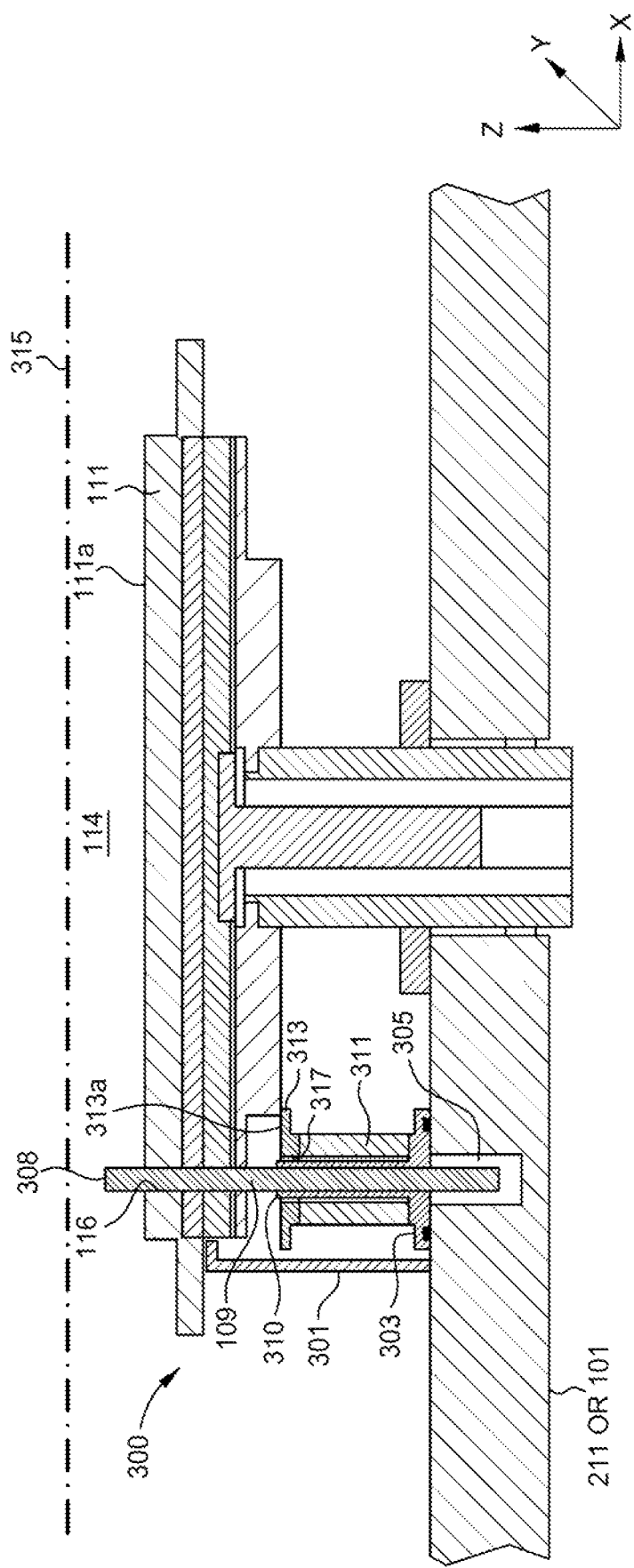
FIG. 3C illustrates movement of the lift pin actuator of FIG. 3A according to at least one embodiment of the present disclosure.
Figure 4:
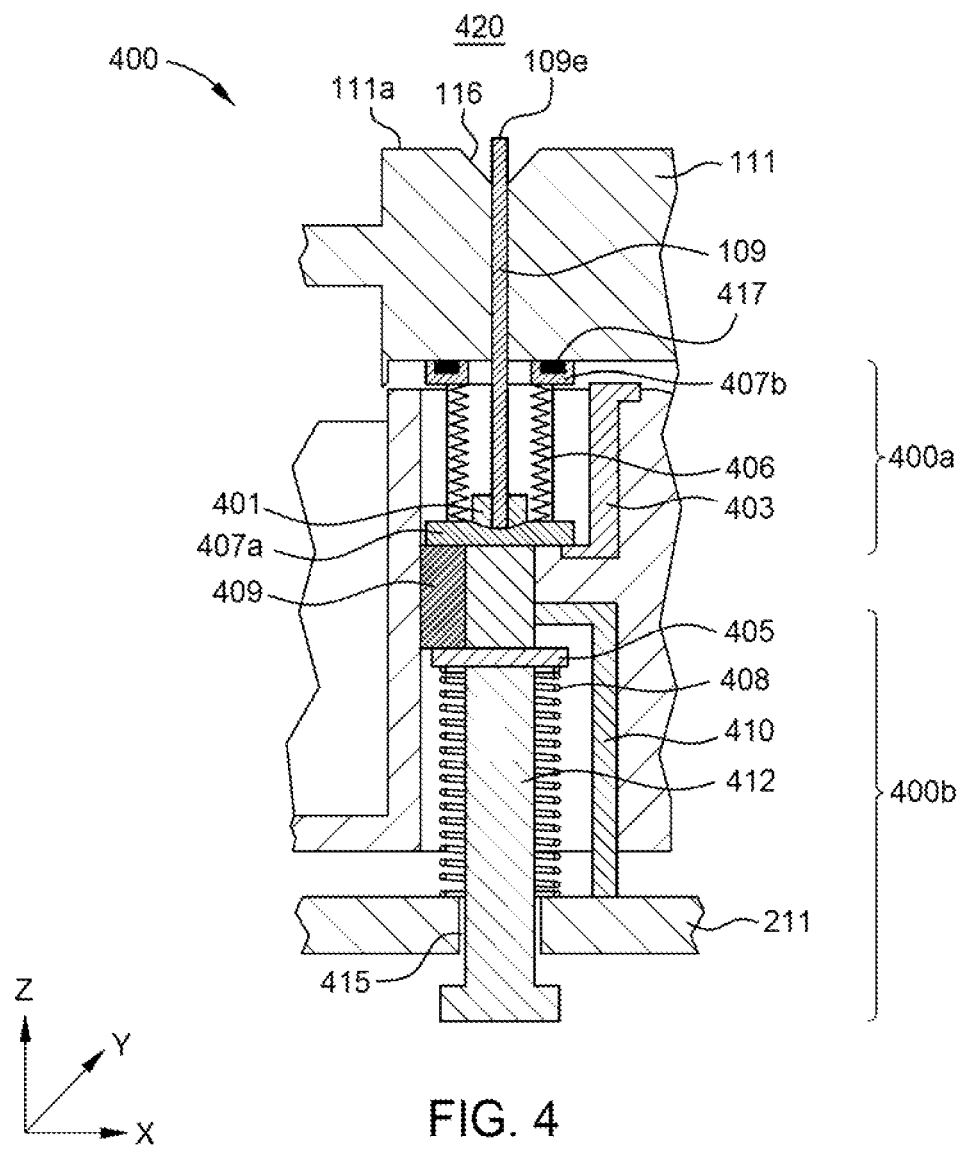
FIG. 4 illustrates a schematic cross-sectional view of a lift pin actuator and a lift pin assembly according to at least one embodiment of the present disclosure.

Embodiments of the present disclosure also relate to lift pin actuators, examples of which are shown in FIGS. 2, 3, and 4. Generally, the lift pin actuators described herein move in response to movement of, e.g., a substrate support, a push rod, and/or a compressible element such as a bellows or spring. The lift pin actuators can be used in, e.g., a chamber of a cluster tool, however other chambers and tools are contemplated. The lift pin actuators described herein can replace conventional assemblies having motors, drivers, and linear motion rails. Moreover, the lift pin actuators can be free of software control.

FIG. 2 is a schematic of a lift pin actuator 200 according to at least one embodiment. The lift pin actuator 200 includes a spring 205 positioned around an outside diameter of a push rod 207. Portions of the push rod 207 have differing diameters or sizes. For example, a collar 207a extends from a main body 207b of the push rod 207. An upper surface 207c of the collar 207a provides a contact point with the substrate support by a flange 209. A lower surface 207d of the collar 207a, along with a chamber body 211, positionally confines the spring 205. Alternatively, a hoop ring, such as hoop ring 101, can be used instead to confine the spring 205 instead of the chamber body 211. An upper surface 207e of the push rod 207 is coupled, directly or indirectly, to a lift pin 109. The push rod 207 is moveable into and out of a cavity 213 formed in the chamber body 211 (or the hoop ring 101).

In a processing chamber, e.g., chamber 102, the substrate support 111 is positioned above the lift pin actuator 200. The substrate support 111 has lift pin holes 116 through which the lift pin 109 can project and retract for substrate handling. Generally, the lift pin actuator 200 moves in response to the substrate support 111 which is coupled to the flange 209 by, e.g., bolts or screws. The flange 209 can be a mini-volume flange. In the position shown in FIG. 2, the flange 209 does not contact the collar 207a of the push rod 207. Thus, as the substrate support 111 is lowered, the lift pin 109 is stationary until the flange 209 coupled to the substrate support 111 contacts the push rod 207 and enables movement of the lift pin 109 along with the substrate support 111.

In operation, as the substrate support 111 moves downward along the z-axis, the lift pin 109 projects through the lift pin hole 116 of the substrate support 111. As the substrate support 111 moves further downward, the flange 209 contacts the push rod 207 (via collar 207a) and the spring 205 contracts. Since the push rod 207 is coupled to the lift pin 109, the push rod 207 and the lift pin 109 move together with the substrate support 111, after the flange contacts the push rod 207, so as to allow substrate 201 to rest on a transfer arm 203. This completes exchange between robot and lift pin. Lift pin 109 retracts relative to flange 111 when there is a gap created between the lift pin 109 and the upper surface 207e of the push rod 207. This can occur when the push rod 207 attains the maximum upward position. The substrate support 111 rises further up and lift pin 109 falls in the lift pin hole 116 under the influence of gravity.

In the position shown, and as a non-limiting illustration, the transfer arm 203 can lift the substrate 201 and transfer the substrate 201 to a different chamber of the cluster tool.

FIG. 3A shows a schematic cross-sectional view of a lift pin actuator 300 according to at least one embodiment. The lift pin actuator 300 includes a compressible element 311 and a stopper 301. The compressible element can be, e.g., a bellows, a spring, or a similar element having compressive properties. The compressible element 311 is positioned around the lift pin 109 such that the lift pin 109 is moveable through an opening 317 of the compressible element 311. A guide bushing 310 is located within the opening 317 of compressible element 311, which can serve to grip the lift pin 109. The stopper 301 is coupled to a chamber body 211 or to a hoop ring 101 depending on the desired configuration. The stopper 301 confines vertical movement of the compressible element 311 and enables pre-tension or pre-loading of the compressible element 311. A compressible element flange 313 can be coupled to the compressible element 311. Alternatively, compressible element 311 and compressible element flange 313 can be a single part. A surface 313a of the compressible element flange 313 (or compressible element 311, if a single part) provides a contact point with the substrate support 111. The compressible element 311 is also coupled to the chamber body 211 by, e.g., a mounting adapter 303. The opening 317 of compressible element 311 is positioned above a cavity 305 formed in the chamber body 211 (or hoop ring 101). At least a portion of the lift pin 109 is moveable into and out of the cavity 305.

In a processing chamber, such as the chamber 102, the substrate support 111 is positioned above the lift pin actuator 300. The substrate support 111 has lift pin holes 116 through which the lift pin 109 can project and retract for substrate handling. Generally, the lift pin actuator 300 moves in response to the substrate support 111. For example, vertical movement of the substrate support 111 along the z-axis causes movement (e.g., expansion and contraction) of the compressible element 311 of the lift pin actuator 300. In the position shown in FIG. 3A, the substrate support does not contact the compressible element flange 313 (or compressible element 311, if a single part). When the substrate support 111 is downwardly, the lift pin 109 is held stationary until, the substrate support 111 contacts the compressible element flange 313 (or compressible element 311, if a single part), at which point the lift pin 109 is lowered at the same rate as the substrate support 111 upon further downward movement.

FIG. 3A, along with FIGS. 3B and 3C, illustrate movement (three positions) of the lift pin actuator 300 and the substrate support 111 within the process volume 114 of the chamber 102, though more or less positions are contemplated. In addition, the configurations of FIGS. 3A-3C illustrate that the lift pin actuator 300 is not providing isolation of the process volume 114, though embodiments enabling isolation via use of the lift pin actuator 300 are contemplated. Instead, a substrate (not shown) can form a seal by use of, e.g., electrostatic chucking.

In operation, and in the position illustrated in FIG. 3A, the shaft of the lift pin 109 extends into the lift pin hole 116, but a top surface 109e of the lift pin 109 is below a top surface 111a of the substrate support 111. Here, the top surface 109e of the lift pin 109 is at or near a substrate transfer plane 315, and the top surface 111a of the substrate support 111 is above the substrate transfer plane 315. In this position, the compressible element 311 is free of contact with the substrate support 111 and the top surface 109e of lift pin 109 is at a first height relative to the substrate transfer plane 315.

As the substrate support 111 moves downward along the z-axis to a second position (FIG. 3B), the substrate support 111 contacts the compressible element 311 and the top surface 109e of lift pin 109 is at the substrate transfer plane 315. At this position, the lift pin 109 extends through the lift pin hole 116 and a top surface 109e of the lift pin 109 is above the top surface 111a of the substrate support 111. Here, the top surface 109e of the lift pin 109 remains at or near the substrate transfer plane 315, and the top surface 111a of the substrate support 111 is now below the substrate transfer plane 315. Because a portion of the lift pin 109 is projecting through lift pin hole 116 of the substrate support 111, the lift pin 109 can, e.g., lift a substrate (not shown) off of the top surface 111a of the substrate support 111.

With further downward movement of the substrate support 111 to a third position (FIG. 3C), the substrate support 111 pushes down on the compressible element 311 and compresses the compressible element 311. As a result, the lift pin 109 moves further into the cavity of the chamber body 211 (or hoop ring 101) such that the top surface 109e of lift pin 109 is at a second height relative to the substrate transfer plane 315. In this position, a portion of the lift pin 109 extends through the lift pin hole 116 of the substrate support 111 and a top surface 109e of the lift pin 109 is above the top surface 111a of the substrate support 111. Here, the top surface 109e of the lift pin 109 and the top surface 111a of the substrate support 111 are both below the substrate transfer plane 315. Because the top surface 109e of the lift pin 109 and the top surface 111a of the substrate support 111 are below the substrate transfer plane 315, a transfer arm (not shown) can be used to pick up the substrate.

The mechanism of action for the hardware shown in FIGS. 2 and 4 and the position of the various components relative to a substrate transfer plane is similar to that described in FIGS. 3A-3C. In FIG. 2, instead of the substrate support contacting the compressible element 311, the substrate support 111 directly or indirectly contacts the push rod (e.g., push rod 207 in FIG. 2). In FIG. 4, the substrate support contacts a bellows and a push rod provides further control over the height of the lift pin as described below.

FIG. 4 is a schematic cross-section of a lift pin apparatus 400 according to at least one embodiment of the present disclosure. The lift pin apparatus includes a lift pin assembly 400a and a lift pin actuator 400b. The lift pin assembly 400a isolates a process volume 420 from components and volumes external to the process volume 420. Such isolation enables maintaining process gases within the process volume 420 and prevents pressure loss from the process volume 420. The lift pin actuator 400b, among other components, enables vertical movement of the lift pin 109. Movement of the substrate support 111 within the process volume 420 provides further control over the height of the lift pin 109 relative to the top surface 111a of the substrate support 111.

The lift pin assembly 400a includes a bellows 406 positioned around a portion of the lift pin 109. A top bellows flange 407b and a bottom bellows flange 407a are positioned above and below the bellows 406, respectively, and around an outside diameter of the lift pin 109. The bellows flanges 407a, 407b are also sealed to bellows 406, such as by welding. The bottom bellows flange 407a is secured by a stopper 403. The stopper 403 is configured to resist movement of the bellows 406, thereby enabling pre-loading or pre-tension of the bellows 406. A centering crown 401 is positioned on an upper surface of the bottom bellows flange 407a. The centering crown 401 is designed such that the lift pin 109 sits snugly within it. An O-ring 417 (or seal) is positioned above the top surface of the top bellows flange 407b and around an outside diameter of the lift pin 109. The O-ring 417 seals the top bellows flange 407b against the bottom surface of the substrate support 111. Bellows 406 and O-ring 417 provide positive sealing and prevent (or at least mitigate) gas leakage between, e.g., two different pressure environments within the same chamber body.

The lift pin actuator 400b includes a push rod 412 and a spring 408 positioned around an outside diameter of the push rod 412. A push rod flange 405 is also positioned around, and attached to, an outside diameter of push rod 412. The spring 408 is confined by the chamber body 211 (or hoop ring 101 as applicable) and the push rod flange 405. The push rod 412 is moveable into and out of a cavity 415 of the chamber body 211 (or the hoop ring 101). A stopper 410 is coupled to the chamber body 211 or to the hoop ring 101 depending on the desired configuration. The stopper 410 confines vertical movement of the spring 408 and enables pre-tension or pre-loading of the spring 408.

Height control of the lift pin 109 relative to, e.g., the substrate support 111 and a substrate transfer plane (not shown), can be controlled by movement of the substrate support 111, movement of the push rod 412, or both. Here, the bellows 406 expands and contracts via movement of, e.g., the substrate support 111 along the z-axis. Because the substrate support 111 moves up and down, the height of the lift pins 109 can be adjusted relative to the upper surface 111a of the substrate support 111. In addition, expansion and contraction of the bellows 406 is further controlled by contact of the push rod 412 with the bottom bellows flange 407a. Here, the push rod 412 can contact the bottom bellows flange 407a of the lift pin assembly 400a and further compress the bellows 406 once the substrate support 111 moves down. That is, vertical movement of the push rod 412 along the z-axis further compresses the bellows 406 and pushes the lift pin 109 upward.

Further, an element 409 (e.g., a flange) can provide additional height-adjustment control for, e.g., transferring a substrate to a robot. As shown, the element 409 is disposed between push rod flange 405 and bottom bellows flange 407a. Although the position shown in FIG. 4 has element 409 contacting the push rod flange 405 and bottom bellows flange 407a, when the substrate support is in a raised position, the element 409 may not be in contact with the push rod flange 405, the bottom bellows flange 407a, or both.

In operation, FIG. 4 shows the top surface 109e of the lift pin 109 above the top surface 111a of the substrate support 111. Thus, the substrate support 111 has already moved downward from a processing position. This prior movement of the substrate support 111 downward caused compression of the bellows 406, such that the top surface 109e of the lift pin 109 projects through the lift pin hole 116 of the substrate support 111 and is located at a certain height above the top surface 111a of the substrate support 111 and at a certain height relative to the substrate transfer plane (not shown). Further movement of the substrate support 111 downward caused contact between the bottom bellows flange 407a and the push rod 412, resulting in further compression of the bellows 406 and a height adjustment of the top surface 109e of the lift pin 109 relative to the top surface 111a of the substrate support 111 and/or the substrate transfer plane. As the substrate support 111 moves further downward, the bottom bellows flange 407a contacts and pushes element 409 against the push rod flange 405 to move the push rod 412 further downward (as shown). Such action results in another height adjustment of the top surface 109e of the lift pin 109 along with the top surface 111a of the substrate support 111 relative to the substrate transfer plane.

Embodiments of the present disclosure enable positive vacuum sealing in order to, e.g., avoid cross contamination and allow for the flexibility to run multiple processes simultaneously. Embodiments also enable improved pin-to-pin shifting, providing for, e.g., lesser particle generation and better process uniformity relative to conventional substrate handling mechanisms. Further, embodiments described herein enable a drive-less configuration for lift-pin actuation, providing for, e.g., less complexity, decreased costs, improved reliability, and improved serviceability over conventional lift-pin actuation assemblies. In contrast to conventional designs that utilize active drives and motors to cause movement of the lift pin, embodiments described herein enable lift pin movement without such components.

In the foregoing, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the foregoing aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

For purposes of this present disclosure, and unless otherwise specified, all numerical values within the detailed description and the claims herein are modified by "about" or "approximately" the indicated value, and consider experimental error and variations that would be expected by a person having ordinary skill in the art. For the sake of brevity, only certain ranges are explicitly disclosed herein. Additionally, within a range includes every point or individual value between its end points even though not explicitly recited. Thus, every point or individual value may serve as its own lower or upper limit combined with any other point or individual value or any other lower or upper limit, to recite a range not explicitly recited.

As used herein, the indefinite article "a" or "an" shall mean "at least one" unless specified to the contrary or the context clearly indicates otherwise.

While the foregoing is directed to embodiments of the present disclosure, other and further embodiments of the disclosure may be devised without departing from the basic scope thereof, and the scope thereof is determined by the claims that follow.

What is claimed is:

1. An apparatus for positioning a substrate in a chamber, comprising:
 a chamber component;
 a lift pin having a top surface for supporting the substrate;
 a stopper coupled to the chamber component; and
 a compressible element assembly positioned between the chamber component and the stopper, wherein the compressible element assembly comprises:
  a compressible element positioned around the lift pin, the lift pin being moveable relative to a substrate transfer plane by movement of a substrate support in direct contact with a portion of the compressible element assembly, the substrate support having a top surface configured to support the substrate.

2. The apparatus of claim 1, wherein the chamber component has a cavity formed therein in which the lift pin is moveably disposed.

3. The apparatus of claim 1, wherein the compressible element assembly is expandable and contractible by vertical movement of the substrate support.

4. The apparatus of claim 1, wherein the chamber component is a chamber body.

5. The apparatus of claim 1, wherein the chamber component is a hoop ring.

6. The apparatus of claim 1, wherein when the chamber component is a hoop ring, the compressible element is expandable and contractible by:
- vertical movement of the hoop ring,
- vertical movement of the substrate support, or both.

7. The apparatus of claim 1, wherein the lift pin is moveable into:
- a first position where the lift pin extends into a lift pin hole of the substrate support and the top surface of the lift pin is below the top surface of the substrate support such that the top surface of the lift pin is at or near the substrate transfer plane and the top surface of the substrate support is above the substrate transfer plane;
- a second position where the top surface of the lift pin is above the top surface of the substrate support such that the top surface of the lift pin is at or near the substrate transfer plane and the top surface of the substrate support is below the substrate transfer plane; and
- a third position where the top surface of the lift pin is above the top surface of the substrate support such that both the top surface of the lift pin and the top surface of the substrate support are below the substrate transfer plane.

8. The apparatus of claim 7, wherein:
- when the lift pin is in the first position, the compressible element is free of contact with the substrate support and the top surface of the lift pin is at a first height relative to the substrate transfer plane; and
- when the lift pin is in the third position, the compressible element is at least partially compressed by contact with the substrate support and the top surface of the lift pin is at a second height relative to the substrate transfer plane, the first height and the second height being different.

9. The apparatus of claim 1, wherein the compressible element assembly further comprises:
- a compressible element flange coupled above the compressible element; and
- a mounting adaptor coupled below compressible element, wherein the mounting adaptor is further coupled to the chamber component.

10. The apparatus of claim 9, wherein the portion of the compressible element assembly in contact with the substrate support is a portion of the compressible element flange.

11. An apparatus for positioning a substrate in a chamber, comprising:
- a chamber component;
- a substrate support;
- a lift pin having a top surface for supporting the substrate;
- a stopper coupled to the chamber component; and
- a compressible element assembly positioned between the chamber component and the stopper, wherein the compressible element assembly comprises:
  - a compressible element positioned around the lift pin, the lift pin being moveable relative to a substrate transfer plane by movement of the substrate support in contact with a portion of the compressible element assembly, the substrate support having a top surface configured to support the substrate, wherein the lift pin is moveable into:
    - a first position where the lift pin extends into a lift pin hole of the substrate support and the top surface of the lift pin is below the top surface of the substrate support such that the top surface of the lift pin is at or near the substrate transfer plane and the top surface of the substrate support is above the substrate transfer plane;
    - a second position where the top surface of the lift pin is above the top surface of the substrate support such that the top surface of the lift pin is at or near the substrate transfer plane and the top surface of the substrate support is below the substrate transfer plane; and
    - a third position where the top surface of the lift pin is above the top surface of the substrate support such that both the top surface of the lift pin and the top surface of the substrate support are below the substrate transfer plane.

12. The apparatus of claim 11, wherein:
- when the lift pin is in the first position, the compressible element is free of contact with the substrate support and the top surface of the lift pin is at a first height relative to the substrate transfer plane; and
- when the lift pin is in the third position, the compressible element is at least partially compressed by contact with the substrate support and the top surface of the lift pin is at a second height relative to the substrate transfer plane, the first height and the second height being different.

13. An apparatus for positioning a substrate in a chamber, comprising:
- a chamber component;
- a lift pin having a top surface for supporting the substrate;
- a stopper coupled to the chamber component; and
- a compressible element assembly positioned between the chamber component and the stopper, wherein the compressible element assembly comprises:
  - a compressible element positioned around the lift pin,
  - a compressible element flange coupled above the compressible element; and
  - a mounting adaptor coupled below the compressible element and further coupled to the chamber component, wherein
    - the lift pin is moveable relative to a substrate transfer plane by movement of a substrate support in contact with the compressible element flange, the substrate support comprising a top surface configured to support the substrate.

* * * * *